United States Patent
Shang et al.

(10) Patent No.: US 11,887,657 B2
(45) Date of Patent: Jan. 30, 2024

(54) AMPLIFIER CIRCUIT, CONTROL METHOD, AND MEMORY

(71) Applicant: CHANGXIN MEMORY TECHNOLOGIES, INC., Hefei (CN)

(72) Inventors: Weibing Shang, Hefei (CN); Hongwen Li, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 101 days.

(21) Appl. No.: 17/805,927

(22) Filed: Jun. 8, 2022

(65) Prior Publication Data

US 2023/0238052 A1 Jul. 27, 2023

Related U.S. Application Data

(63) Continuation of application No. PCT/CN2022/077784, filed on Feb. 24, 2022.

(30) Foreign Application Priority Data

Jan. 27, 2022 (CN) .......................... 202210101568.7

(51) Int. Cl.
*G11C 7/04* (2006.01)
*G11C 11/4091* (2006.01)

(52) U.S. Cl.
CPC ............ *G11C 11/4091* (2013.01); *G11C 7/04* (2013.01)

(58) Field of Classification Search
CPC ...................................................... G11C 7/04
See application file for complete search history.

(56) References Cited

U.S. PATENT DOCUMENTS 10,224,093 B2  3/2019  Kim et al.
10,236,036 B2  3/2019  Ingalls et al.
(Continued)

FOREIGN PATENT DOCUMENTS

CN    105469824 A    4/2016
CN    108257631 A    7/2018
(Continued)

OTHER PUBLICATIONS

International Search Report cited in PCT/CN2022/077786 dated Oct. 25, 2022, 9 pages.
(Continued)

*Primary Examiner* — Jason Lappas
(74) *Attorney, Agent, or Firm* — Cooper Legal Group, LLC

(57) ABSTRACT

The present disclosure relates to an amplifier circuit, a control method, and a memory, including: a sensing amplification circuit, including a readout node, a complementary readout node, a first node, and a second node; an isolation circuit, coupled to the readout node, the complementary readout node, a bit line, and a complementary bit line, wherein the isolation circuit is configured to couple the readout node to the bit line and the complementary readout node to the complementary bit line at a sensing amplification stage; an offset cancellation circuit, coupled to the bit line, the complementary bit line, the readout node, and the complementary readout node, wherein the offset cancellation circuit is configured to couple the bit line to the complementary readout node and the complementary bit line to the readout node at an offset cancellation stage; and a processing circuit, coupled to the offset cancellation circuit.

15 Claims, 5 Drawing Sheets

(56) References Cited

U.S. PATENT DOCUMENTS

| | | |
|---|---|---|
| 10,522,197 B2 | 12/2019 | Choi et al. |
| 10,541,022 B2 | 1/2020 | Kim et al. |
| 10,692,565 B2 | 6/2020 | Kim et al. |
| 10,726,886 B2 | 7/2020 | Choi et al. |
| 11,024,364 B2 | 6/2021 | Seo et al. |
| 11,024,365 B1 | 6/2021 | Seo et al. |
| 11,043,257 B2 | 6/2021 | Kim et al. |
| 11,276,443 B2 | 3/2022 | Brox et al. |
| 2016/0352223 A1* | 12/2016 | Choo .................... H03F 1/301 |
| 2018/0061461 A1 | 3/2018 | Seo |

FOREIGN PATENT DOCUMENTS

| | | |
|---|---|---|
| CN | 109767799 A | 5/2019 |
| CN | 110574109 A | 12/2019 |
| CN | 110992997 A | 4/2020 |
| CN | 111081296 A | 4/2020 |
| CN | 111161764 A | 5/2020 |
| CN | 111292783 A | 6/2020 |
| CN | 112767975 A | 5/2021 |
| CN | 112997250 A | 6/2021 |

OTHER PUBLICATIONS

International Search Report cited in PCT/CN2022/077785 dated Oct. 25, 2022, 10 pages.
International Search Report cited in PCT/CN2022/077784 dated Oct. 10, 2022, 10 pages.

\* cited by examiner

AMPLIFIER CIRCUIT, CONTROL METHOD, AND MEMORY

CROSS-REFERENCE TO RELATED APPLICATIONS

This is a continuation of International Application No. PCT/CN2022/077784, filed on Feb. 24, 2022, which claims the priority to Chinese Patent Application No. 202210101568.7, titled "AMPLIFIER CIRCUIT, CONTROL METHOD, AND MEMORY" and filed on Jan. 27, 2022. The entire contents of International Application No. PCT/CN2022/077784 and Chinese Patent Application No. 202210101568.7 are incorporated herein by reference.

TECHNICAL FIELD

The present disclosure relates to the field of semiconductor circuit design, and in particular, to an amplifier circuit, a control method, and a memory.

BACKGROUND

A dynamic random access memory (DRAM) stores data by using charges in a cell capacitor. The cell capacitor couples a bit line and a complementary bit line. In the DRAM, when a read/write operation or a refresh operation is performed, an amplifier circuit needs to read out and amplify a voltage difference between the bit line and the complementary bit line.

Transistors constituting the amplifier circuit may have different device features due to process variations, temperatures, and other factors. For example, matching transistors have different threshold voltages. Such different device features lead to offset noise in the amplifier circuit. The existence of the offset noise in the amplifier circuit reduces an effective readout margin of the amplifier circuit, resulting in degraded performance of the DRAM.

SUMMARY

Embodiments of the present disclosure provide an amplifier circuit, coupled to a bit line and a complementary bit line, and including: a sensing amplification circuit, including a readout node, a complementary readout node, a first node, and a second node, where at a sensing amplification stage and an offset cancellation stage, the first node is configured to receive a high level, and the second node is configured to receive a low level; an isolation circuit, coupled to the readout node, the complementary readout node, the bit line, and the complementary bit line, where the isolation circuit is configured to couple the readout node to the bit line and the complementary readout node to the complementary bit line at the sensing amplification stage; an offset cancellation circuit, coupled to the bit line, the complementary bit line, the readout node, and the complementary readout node, where the offset cancellation circuit is configured to couple the bit line to the complementary readout node and the complementary bit line to the readout node at the offset cancellation stage; and a processing circuit, coupled to the offset cancellation circuit, and configured to obtain a memory temperature and adjust duration of the offset cancellation stage based on the memory temperature.

The embodiments of the present disclosure further provide a control method, applying the amplifier circuit provided in the foregoing embodiment, and including: obtaining the memory temperature; and adjusting the duration of the offset cancellation stage based on the memory temperature.

The embodiments of the present disclosure further provide a memory, including the amplifier circuit provided in the foregoing embodiment, wherein the amplifier circuit is configured to perform a read/write operation on data.

BRIEF DESCRIPTION OF THE DRAWINGS

One or more embodiments are exemplified by figures in the corresponding accompanying drawings, and these exemplified descriptions do not constitute any limitation on the embodiments. Unless otherwise stated, the figures in the accompanying drawings do not constitute a scale limitation. To describe the technical solutions in the embodiments of the present disclosure or in the prior art more clearly, the following briefly describes the accompanying drawings required in the embodiments. Apparently, the accompanying drawings in the following description are merely some embodiments of the present disclosure. Those of ordinary skill in the art may derive other drawings from these accompanying drawings without creative efforts.

DETAILED DESCRIPTION

Transistors constituting the amplifier circuit may have different device features due to process variations, temperatures, and other factors. For example, matching transistors have different threshold voltages. Such different device features lead to offset noise in the amplifier circuit. The existence of the offset noise in the amplifier circuit reduces an effective readout margin of the amplifier circuit, resulting in degraded performance of the DRAM.

In order to cancel offset noise in an amplifier circuit, an offset cancellation stage is added before a sensing amplification stage. However, the offset cancellation stage needs to additionally occupy a data processing time. This affects a data processing timing of a memory. Therefore, how to ensure accuracy of offset cancellation and reduce a processing time of the offset cancellation stage is of great significance to performance improvement of the memory.

An embodiment of the present disclosure provides an amplifier circuit, which dynamically adjusts a processing time of an offset cancellation stage based on a temperature while ensuring accuracy of offset cancellation, so as to optimize performance of a memory.

Those of ordinary skill in the art should understand that many technical details are proposed in the embodiments of the present disclosure to make the present disclosure better understood. However, even without these technical details and various changes and modifications made based on the following embodiments, the technical solutions claimed in the present disclosure may still be realized. The following divisions of the various embodiments are intended for convenience of description, and are not intended to constitute any limitation to the specific implementation of the present disclosure. The various embodiments may be combined with each other in case of no contradiction.

Figure 1:
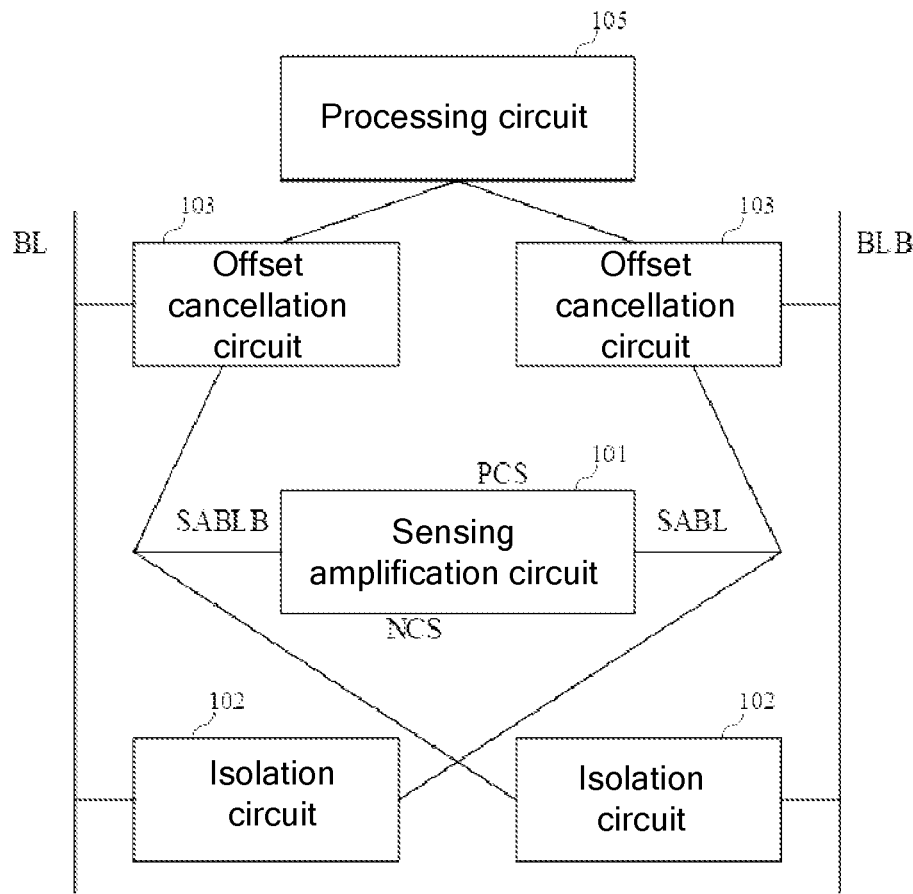
FIG. 1 is a schematic diagram of a virtual structure of an amplifier circuit according to an embodiment of the present disclosure.
Figure 2:
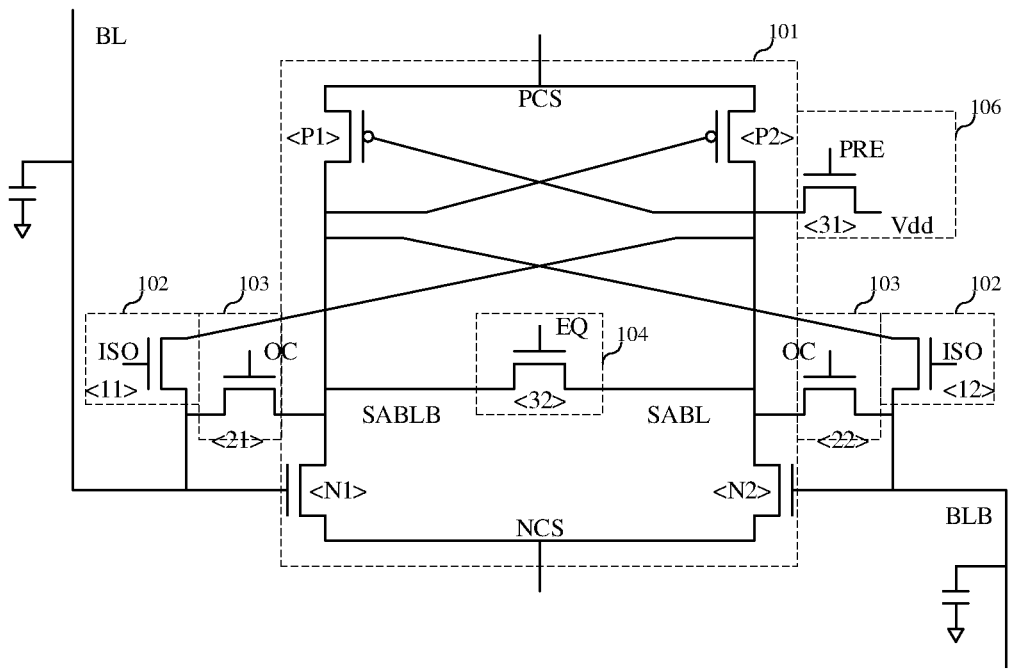
FIG. 2 is a schematic diagram of a circuit structure of an amplifier circuit according to an embodiment of the present disclosure.
Figures 3, 4:
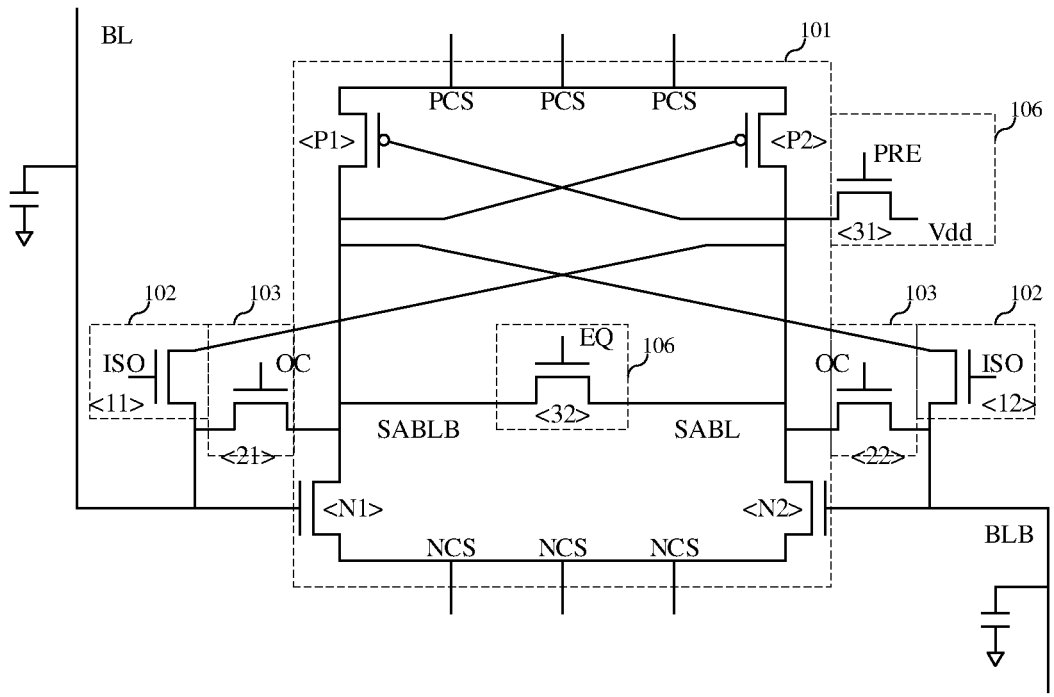
FIG. 3 is a schematic diagram of another circuit structure of an amplifier circuit according to an embodiment of the present disclosure.
FIG. 4 is a schematic structural diagram of a processing circuit according to an embodiment of the present disclosure.
Figure 5:
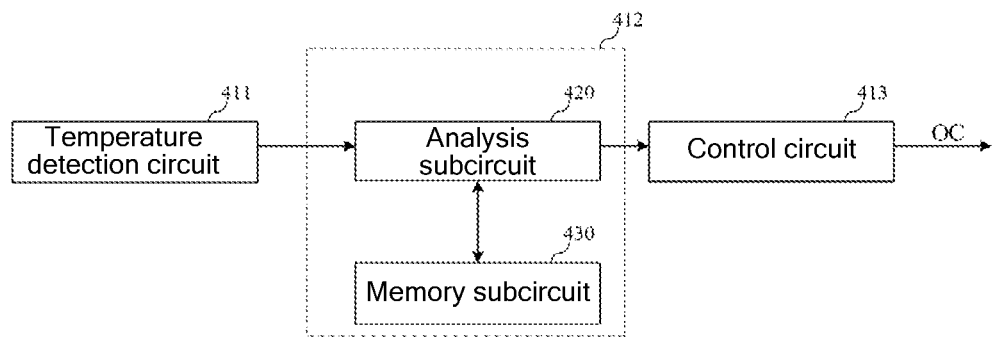
FIG. 5 is a schematic structural diagram of a configuration circuit according to an embodiment of the present disclosure.
Figure 6:
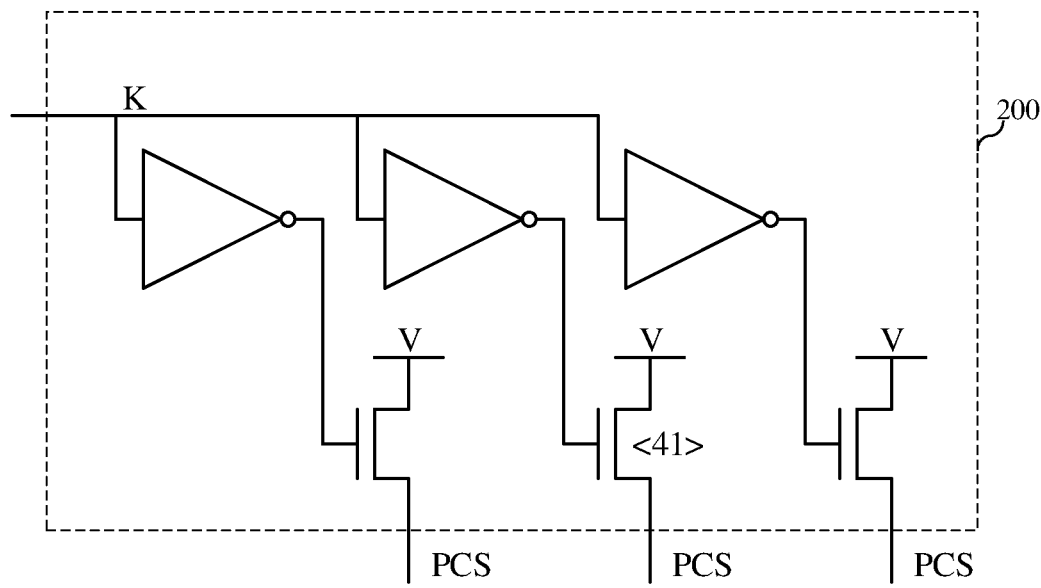
FIG. 6 is a schematic structural diagram of a first power supply circuit according to an embodiment of the present disclosure.
Figure 7:
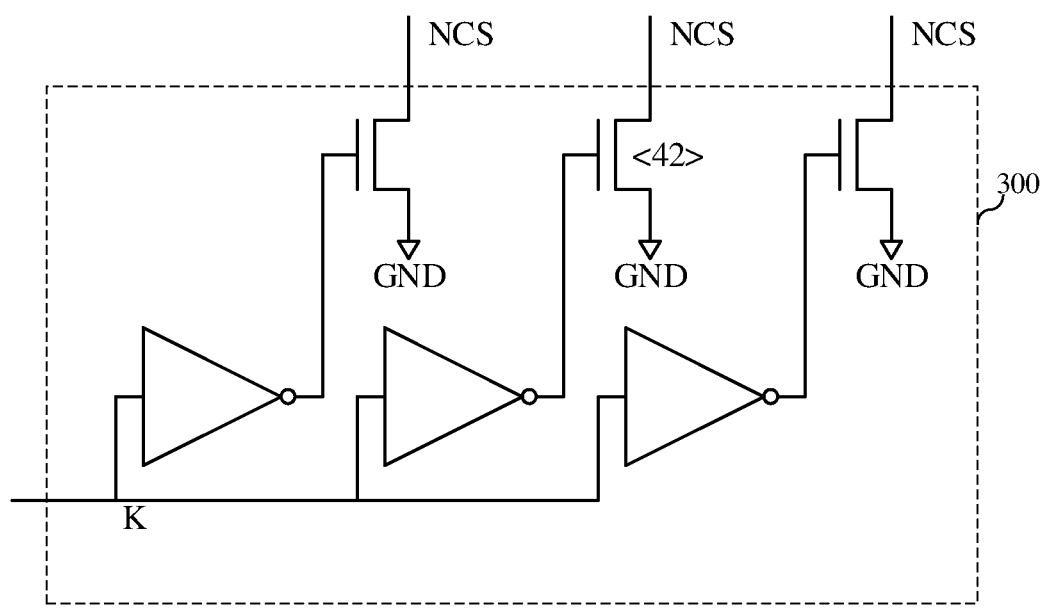
FIG. 7 is a schematic structural diagram of a second power supply circuit according to an embodiment of the present disclosure.

FIG. 1 is a schematic diagram of a virtual structure of an amplifier circuit according to the embodiments. FIG. 2 is a schematic diagram of a circuit structure of an amplifier circuit according to the embodiments. FIG. 3 is a schematic diagram of another circuit structure of an amplifier circuit according to the embodiments. FIG. 4 is a schematic structural diagram of a processing circuit according to the embodiments. FIG. 5 is a schematic structural diagram of a configuration circuit according to the embodiments. FIG. 6 is a schematic structural diagram of a first power supply circuit according to the embodiments. FIG. 7 is a schematic structural diagram of a second power supply circuit according to the embodiments. The amplifier circuit provided in the embodiments is further described below in detail with reference to the accompanying drawings, and the details are as follows:

Referring to FIG. 1 to FIG. 3, the amplifier circuit is coupled to a bit line BL and a complementary bit line BLB, and includes:
- a sensing amplification circuit 101, including a readout node SABL, a complementary readout node SABLB, a first node PCS, and a second node NCS, where at a sensing amplification stage and an offset cancellation stage, the first node PCS is configured to receive a high level, and the second node NCS is configured to receive a low level; and specifically, the first node PCS is coupled to a power supply node to receive a high level provided by the power supply node; and the second node NCS is coupled to a ground node to receive a low level provided by the ground node;
- an isolation circuit 102, coupled to the readout node SABL, the complementary readout node SABLB, the bit line BL, and the complementary bit line BLB, where the isolation circuit 102 is configured to couple the readout node SABL to the bit line BL and the complementary readout node SABLB to the complementary bit line BLB at the sensing amplification stage;
- an offset cancellation circuit 103, coupled to the readout node SABL, the complementary readout node SABLB, the bit line BL, and the complementary bit line BLB, where the offset cancellation circuit 103 is configured to couple the bit line BL to the complementary readout node SABLB and the complementary bit line BLB to the readout node SABL at the offset cancellation stage; and a processing circuit 105, coupled to the offset cancellation circuit 103, and configured to obtain a memory temperature and adjust duration of the offset cancellation stage based on the memory temperature, where the memory temperature is a temperature of a memory to which the amplifier circuit belongs.

Specifically, if the memory temperature rises, the processing circuit 105 is configured to reduce the duration of the offset cancellation stage based on the memory temperature; or if the memory temperature drops, the processing circuit 105 is configured to extend the duration of the offset cancellation stage based on the memory temperature.

When other conditions are the same, a higher memory temperature indicates that the sensing amplification circuit 101 can complete offset cancellation and sensing amplification more quickly, and a lower memory temperature indicates that the sensing amplification circuit 101 needs a longer time to complete offset cancellation and sensing amplification. Correspondingly, the offset cancellation time is appropriately reduced when the memory temperature rises, and the offset cancellation time is appropriately extended when the memory temperature drops. The appropriate adjustment of the duration of the offset cancellation stage according to the memory temperature at the offset cancellation stage enables dynamic adjustment of the offset cancellation time of the memory to optimize performance of the memory.

In addition, during transmission of data in the memory, a signal transmission rate is mainly determined by a wire resistance of a transmission wire. A higher temperature indicates a larger resistance of the transmission wire and a longer data transmission time. A lower temperature indicates a smaller resistance of the transmission wire and a shorter data transmission time. That is, when the memory temperature rises, the offset cancellation time is reduced but the data transmission time is increased accordingly; when the memory temperature drops, the offset cancellation time is increased but the data transmission time is reduced accordingly. In other words, the offset cancellation time of the memory is set to a time that dynamically changes according to the temperature, and such dynamic change and a time change of a peripheral circuit can cancel each other, without affecting an overall data readout timing of the memory. A data transmission time (for example, a tRCD) in a data transmission path may alternatively be individually set correspondingly according to the memory temperature.

It should be noted that, in a specific application, the data transmission time in the data transmission path may be individually set to different parameters correspondingly according to the memory temperature.

Referring to FIG. 2, the sensing amplification circuit 101 shown in FIG. 2 includes only one first node PCS and one second node NCS. Referring to FIG. 3, the sensing amplification circuit 101 shown in FIG. 3 includes multiple first nodes PCS and multiple second nodes NCS, and the multiple first nodes PCS and the multiple second nodes NCS respectively provide high levels and low levels. It should be noted that, the circuit structure shown in FIG. 3 is specifically described by using three first nodes PCS and three second nodes NCS as an example, which does not constitute a limitation on this embodiment.

Referring to FIG. 1 to FIG. 3, and in conjunction with FIG. 4, the processing circuit 105 includes: a temperature detection circuit 411, configured to obtain the memory temperature; a configuration circuit 412, coupled to the temperature detection circuit 411, and configured to obtain an offset cancellation time corresponding to the memory temperature based on the memory temperature; and a control circuit 413, coupled to the configuration circuit 412 and the offset cancellation circuit 103, and configured to provide an offset cancellation (OC) signal of the offset cancellation time at the offset cancellation stage.

Referring to FIG. 2 and FIG. 3, in this embodiment, the offset cancellation circuit 103 includes: a first offset cancellation transistor <21>, with one of a source or a drain coupled to the bit line BL, the other one of the source or the drain coupled to the complementary readout node SABLB, and a gate used for receiving the offset cancellation signal OC, where the first offset cancellation transistor <21> is configured to be turned on based on the offset cancellation signal OC at the offset cancellation stage to couple the complementary readout node SABLB to the bit line BL; and a second offset cancellation transistor <22>, with one of a source or a drain coupled to the complementary bit line BLB, the other one of the source or the drain coupled to the readout node SABL, and a gate used for receiving the offset cancellation signal OC, where the second offset cancellation transistor <22> is configured to be turned on based on the offset cancellation signal OC at the offset cancellation stage to couple the readout node SABL to the complementary bit line BLB.

It should be noted that, the first offset cancellation transistor <21> and the second offset cancellation transistor <22> may be set as NMOS transistors, or may be set as PMOS transistors. Specific types of the first offset cancellation transistor <21> and the second offset cancellation transistor <22> are not limited in this embodiment.

Specifically, the first offset cancellation transistor <21> and the second offset cancellation transistor <22> are turned on based on the offset cancellation signal OC, to cause the sensing amplification circuit 101 to generate a compensation voltage between the bit line BL and the complementary bit line BLB, and a time for providing the offset cancellation signal OC is determined based on the offset cancellation time, such that the duration of the offset cancellation stage is controlled according to the temperature.

Referring to FIG. 4, and in conjunction with FIG. 5, the configuration circuit 412 includes: a memory subcircuit 430, configured to store a logic relationship between the memory temperature and the offset cancellation time; and an analysis subcircuit 420, coupling the temperature detection circuit 411 and the memory subcircuit 430, wherein the analysis subcircuit 420 is configured to obtain the offset cancellation time corresponding to the memory temperature based on the logic relationship.

Specifically, the memory subcircuit 430 stores the logic relationship between the memory temperature and the offset cancellation time, and the logic relationship is used to indicate the offset cancellation time corresponding to the specific memory temperature. In some embodiments, a same memory temperature range corresponds to a same offset cancellation time, and different memory temperature ranges correspond to different offset cancellation times. In some other embodiments, each memory temperature corresponds to a different offset cancellation time, that is, there is a mapping relationship between memory temperatures and offset cancellation times. The analysis subcircuit 420 obtains the offset cancellation time corresponding to the memory temperature according to the memory temperature obtained by the temperature detection circuit 411 and then with reference to the logic relationship in the memory subcircuit 430.

As mentioned above, the memory temperature affects the offset cancellation time and the data transmission time of the memory. Therefore, in some embodiments, the logic relationship between the memory temperature and the offset cancellation time is configured to unify offset cancellation times and data transmission times at different memory temperatures. Specifically, a preset offset cancellation time and a preset data transmission time at a preset memory temperature are obtained; data transmission times at different memory temperatures are obtained; a data change direction and a data change amount between the data transmission time and the preset data transmission time at different memory temperatures are obtained; and offset cancellation times corresponding to different memory temperatures are obtained based on the preset offset cancellation time, the data change direction, and the data change amount.

In some embodiments, referring to FIG. 3, the amplifier circuit further includes: referring to FIG. 6, a first power supply circuit 200, coupled to the first node PCS, and including a power supply node V, where the first power supply circuit 200 is configured to couple the power supply node V to the first node PCS at the offset cancellation stage and the sensing amplification stage; and referring to FIG. 7, a second power supply circuit 300, coupled to the second node NCS, and including a ground node GND, where the second power supply circuit 300 is configured to couple the ground node GND to the second node NCS at the offset cancellation stage and the sensing amplification stage.

Specifically, the first power supply circuit 200 includes: a first control transistor <41>, with one of a source or a drain coupled to the power supply node V, the other one of the source or the drain coupled to the first node PCS, and a gate used for receiving a control signal K. The second power supply circuit 300 includes: a second control transistor <42>, with one of a source or a drain coupled to the second node NCS, the other one of the source or the drain coupled to the ground node GND, and a gate used for receiving the control signal K. The control signal K is used to turn on the first control transistor <41> and the second control transistor <42> at the offset cancellation stage and the sensing amplification stage.

Specifically, at the offset cancellation stage and the sensing amplification stage, the first control transistor <41> is turned on based on the control signal K to couple the power supply node V to the first node PCS; and the second control transistor <42> is turned on based on the control signal K to couple the ground node GND to the second node NCS.

The control signal K is provided based on a memory to which the amplifier circuit belongs. In some embodiments, the first control transistor <41> and the second control transistor <42> are turned on based on a same control signal K. In some embodiments, the control signal K includes multiple control sub-signals, and the first control transistor <41> and the second control transistor <42> are turned on based on different control sub-signals.

It should be noted that, the first control transistor <41> may be set as an NMOS transistor, or may be set as a PMOS transistor. Because a pull-up capability of the PMOS transistor is better than a pull-up capability of the NMOS transistor, in this embodiment, the first control transistor <41> is set as a PMOS transistor.

It should be noted that, that the second control transistor <42> is turned on based on a high level, that is, the second control transistor <42> is an NMOS transistor is used as an example in this embodiment, but this does not constitute a limitation on this embodiment. Because a pull-down capability of the NMOS transistor is better than a pull-down capability of the PMOS transistor, setting the second control transistor <42> as an NMOS transistor can increase a rate at which the sensing amplification circuit 101 generates a compensation voltage between the bit line BL and the complementary bit line BLB. In other embodiments, the second control transistor may alternatively be set as a PMOS transistor. Correspondingly, in this case, a power voltage of the first control power supply is less than a power voltage of the second control power supply.

In addition, this embodiment is described based on the circuit shown in FIG. 3, and therefore is adapted to the three first nodes PCS and the three second nodes NCS of the circuit shown in FIG. 3, and there are three controllers implementing control of the three first control transistors <41> and the three second control transistors <42>. In some embodiments, the control signal K is also used to selectively turn on the first control transistors <41> and the second control transistors <42>.

Referring to FIG. 2 and FIG. 3, in this embodiment, the sensing amplification circuit 101 includes: a first P-type transistor <P1>, with one of a source or a drain coupled to the first node PCS, the other one of the source or the drain coupled to the complementary readout node SABLB, and a gate coupled to the readout node SABL; a second P-type transistor <P2>, with one of a source or a drain coupled to the first node PCS, the other one of the source of the drain coupled to the readout node SABL, and a gate coupled to the complementary readout node SABLB; a first N-type transistor <N1>, with one of a source or a drain coupled to the second node NCS, the other one of the source or the drain coupled to the complementary readout node SABLB, and a gate coupled to the bit line BL; and a second N-type transistor <N2>, with one of a source or a drain coupled to the second node NCS, the other one of the source or the drain coupled to the readout node SABL, and a gate coupled to the complementary bit line BLB.

Referring to FIG. 2 and FIG. 3, in this embodiment, the isolation circuit 102 includes: a first isolation transistor <11>, with one of a source or a drain coupled to the bit line BL, the other one of the source or the drain coupled to the readout node SABL, and a gate used for receiving an isolation signal (Isolation Cancellation, ISO), where the first isolation transistor <11> is configured to be turned on based on the isolation signal ISO at the sensing amplification stage to couple the readout node SABL to the bit line BL; and a second isolation transistor <12>, with one of a source or a drain coupled to the complementary bit line BLB, the other one of the source or the drain coupled to the complementary readout node SABLB, and a gate used for receiving the isolation signal ISO, where the second isolation transistor <12> is configured to be turned on based on the isolation signal ISO at the sensing amplification stage to couple the complementary readout node SABLB to the complementary bit line BLB.

It should be noted that, the first isolation transistor <11> and the second isolation transistor <12> may be set as NMOS transistors, or may be set as PMOS transistors. Specific types of the first isolation transistor <11> and the second isolation transistor <12> are not limited in this embodiment.

Referring to FIG. 2 and FIG. 3, in this embodiment, the amplifier circuit further includes: a preprocessing circuit 104, coupled to the readout node SABL and the complementary readout node SABLB, where at a charging stage, the preprocessing circuit 104 is coupled to at least one of the readout node SABL or the complementary readout node SABLB, and configured to precharge the bit line BL, the complementary bit line BLB, the readout node SABL, and the complementary readout node SABLB to a preset voltage Vdd based on a precharge signal (Precharge Cancellation, PRE); and at an equilibrium stage, the preprocessing circuit 104 is coupled to both the readout node SABL and the complementary readout node SABLB, and configured to synchronize a node voltage of the readout node SABL and a node voltage of the complementary readout node SABLB based on an equilibrium signal (Equilibrium Cancellation, EQ).

It should be noted that, the preset voltage Vdd is an internal power voltage of the memory to which the amplifier circuit belongs.

Specifically, the preprocessing circuit includes: a charge transistor <31>, with one of a source or a drain coupled to the readout node SABL or the complementary readout node SABLB, the other one of the source or the drain coupled to a node that provides the preset voltage Vdd, and a gate used for receiving the precharge signal PRE, where the charge transistor <31> is configured to be turned on based on the precharge signal PRE at the charging stage to precharge the bit line BL, the complementary bit line BLB, the readout node SABL, and the complementary readout node SABLB to the preset voltage Vdd; and an equilibrium transistor <32>, with one of a source or a drain coupled to the readout node SABL, the other one of the source or the drain coupled to the complementary readout node SABLB, and a gate used for receiving the equilibrium signal EQ, where the equilibrium transistor <32> is configured to be turned on based on the equilibrium signal EQ at the equilibrium stage to synchronize the node voltage of the readout node SABL and the node voltage of the complementary readout node SABLB.

It should be noted that, the charge transistor <31> and the equilibrium transistor <32> may be set as NMOS transistors, or may be set as PMOS transistors. Specific types of the charge transistor <31> and the equilibrium transistor <32> are not limited in this embodiment.

A higher memory temperature indicates that the sensing amplification circuit 101 can complete offset cancellation and sensing amplification more quickly, and a lower memory temperature indicates that the sensing amplification circuit 101 needs a longer time to complete offset cancellation and sensing amplification. Correspondingly, the offset cancellation time is appropriately reduced when the memory temperature rises, and the offset cancellation time is appropriately extended when the memory temperature drops. The appropriate adjustment of the duration of the offset cancellation stage according to the memory temperature at the offset cancellation stage enables dynamic adjustment of the offset cancellation time of the memory to optimize performance of the memory.

It should be noted that, features disclosed in the amplifier circuit provided in the foregoing embodiment can be arbitrarily combined without conflict, and a new amplifier circuit embodiment can be obtained.

Another embodiment of the present disclosure provides a control method, applying the amplifier circuit provided in the foregoing embodiment, to reduce a processing time of the offset cancellation stage while ensure accuracy of offset cancellation, thereby optimizing performance of the memory.

Figure 8:
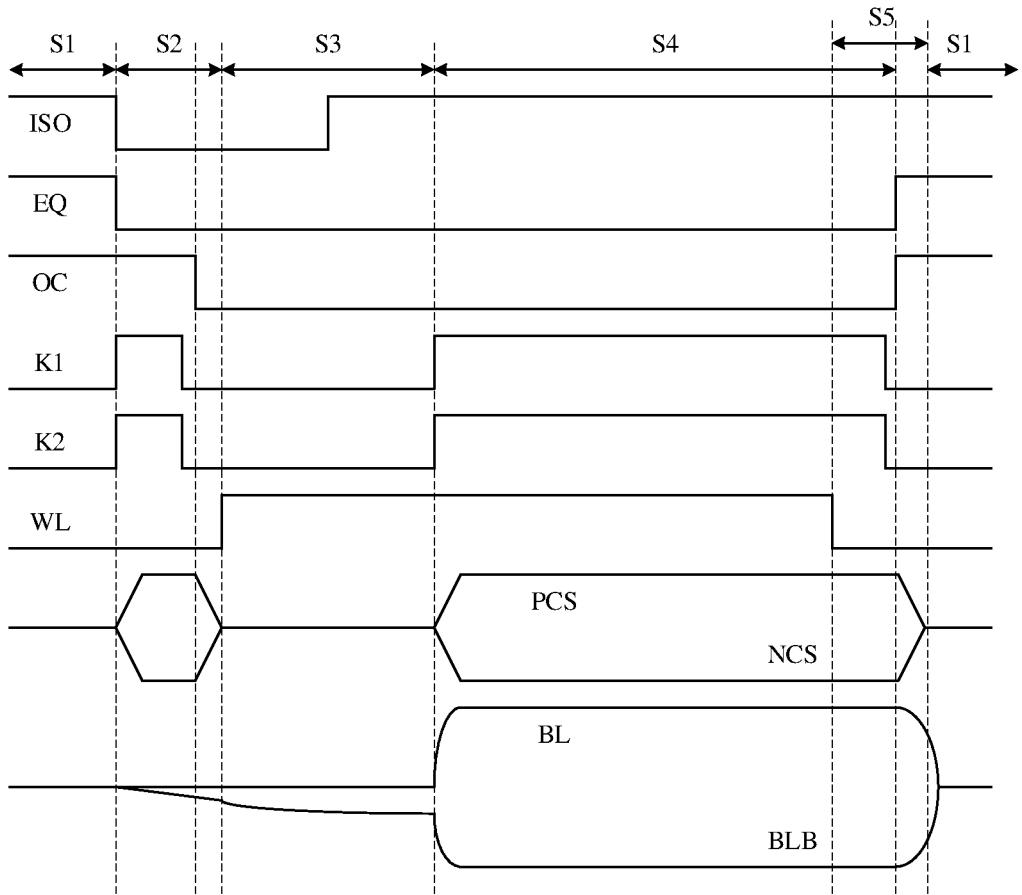
FIG. 8 is a schematic diagram of a timing of each signal during data reading/writing for an amplifier circuit according to another embodiment of the present disclosure.
Figure 9:
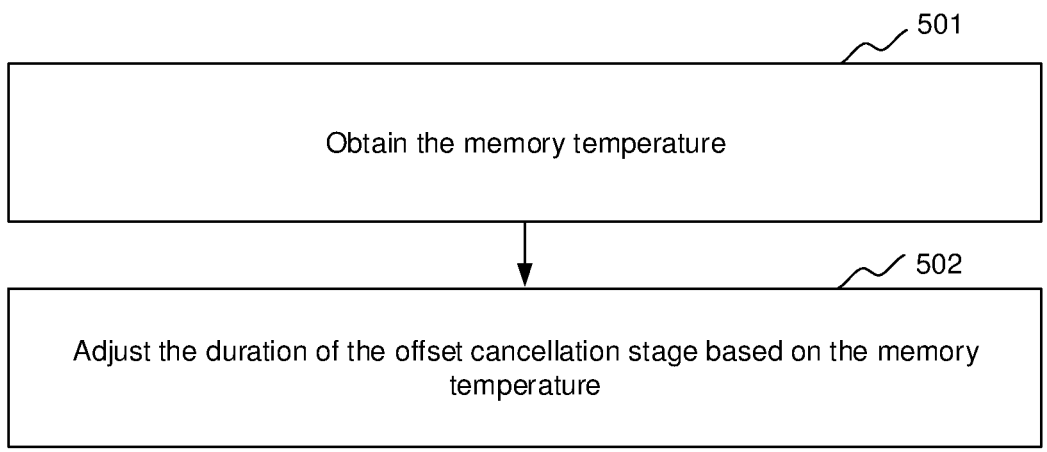
FIG. 9 is a schematic flowchart of a control method according to another embodiment of the present disclosure.

FIG. 8 is a schematic diagram of a timing of each signal during data reading/writing for an amplifier circuit according to the embodiments. FIG. 9 is a schematic flowchart of a control method according to the embodiments. The control method provided in the embodiments is further described below in detail with reference to the accompanying drawings, and the details are as follows:

Referring to FIG. 8, and in conjunction with FIG. 2 and FIG. 3, for the amplifier circuit provided in the foregoing embodiment:

At stage S1, that is, a charging stage, the isolation signal ISO, the offset cancellation signal OC, and the equilibrium signal EQ are provided, to couple the bit line BL, the complementary bit line BLB, the readout node SABL, and the complementary readout node SABLB to each other, and the precharge signal PRE is provided to precharge the bit line BL, the complementary bit line BLB, the readout node SABL, and the complementary readout node SABLB to the preset voltage Vdd.

It should be noted that, the preset voltage Vdd is an internal power voltage of the memory to which the amplifier circuit belongs.

Stage S2, that is, an offset cancellation stage, is used to cancel offset noise in the amplifier circuit.

Specifically, referring to FIG. 9, the offset cancellation stage includes: Step 501, obtain the memory temperature.

Step 502, adjust the duration of the offset cancellation stage based on the memory temperature.

Specifically, the adjusting duration of the offset cancellation stage based on the memory temperature includes: if the memory temperature rises, reducing the duration of the offset cancellation stage based on the memory temperature; or if the memory temperature drops, extending the duration of the offset cancellation stage based on the memory temperature.

In some embodiments, between step 501 and step 502, the following is further included: obtaining an offset cancellation time corresponding to the memory temperature based on the memory temperature. The adjusting the duration of the offset cancellation stage based on the memory temperature includes: adjusting the duration of the offset cancellation stage based on the offset cancellation time. That is, step 502 is adjusting the duration of the offset cancellation stage based on the offset cancellation time.

Specifically, the obtaining an offset cancellation time corresponding to the memory temperature based on the memory temperature includes: obtaining the offset cancellation time corresponding to the memory temperature based on a logic relationship. In one example, referring to FIG. 5, the memory stores a logic relationship between the memory temperature and the offset cancellation time. The logic relationship is used to indicate the offset cancellation time corresponding to the specific memory temperature, such that the offset cancellation time corresponding to the memory temperature is obtained according to the obtained memory temperature with reference to the logic relationship.

In some embodiments, a same memory temperature range corresponds to a same offset cancellation time, and different memory temperature ranges correspond to different offset cancellation times. In some other embodiments, each memory temperature corresponds to a different offset cancellation time, that is, there is a mapping relationship between memory temperatures and offset cancellation times.

In addition, the memory temperature affects the offset cancellation time and the data transmission time of the memory. Therefore, in some embodiments, the logic relationship between the memory temperature and the offset cancellation time is configured to unify offset cancellation times and data transmission times at different memory temperatures. Specifically, a preset offset cancellation time and a preset data transmission time at a preset memory temperature are obtained; data transmission times at different memory temperatures are obtained; a data change direction and a data change amount between the data transmission time and the preset data transmission time at different memory temperatures are obtained; and offset cancellation times corresponding to different memory temperatures are obtained based on the preset offset cancellation time, the data change direction, and the data change amount.

At stage S3, that is, a charge sharing stage, the word line WL is activated to turn on a corresponding memory cell, charges stored in the memory cell are shared to the bit line BL or the complementary bit line BLB, and then based on the isolation signal ISO, the bit line BL is coupled to the readout node SABL and the complementary bit line BLB is coupled to the complementary readout node SABLB.

Stage S4, that is, a sensing amplification stage, is used to amplify a voltage difference between the bit line BL and the complementary bit line BLB.

Stage S5, that is, the end of the sensing amplification stage, is used to read/write data.

It should be noted that, features disclosed in the control method provided in the foregoing embodiment can be arbitrarily combined without conflict, and a new control method embodiment can be obtained.

Still another embodiment of the present disclosure provides a memory, including the amplifier circuit provided in the foregoing embodiment. The amplifier circuit is configured to perform a read/write operation on data. This dynamically adjusts a processing time of an offset cancellation stage based on a temperature while ensuring accuracy of offset cancellation, so as to optimize performance of a memory.

Figure 10:
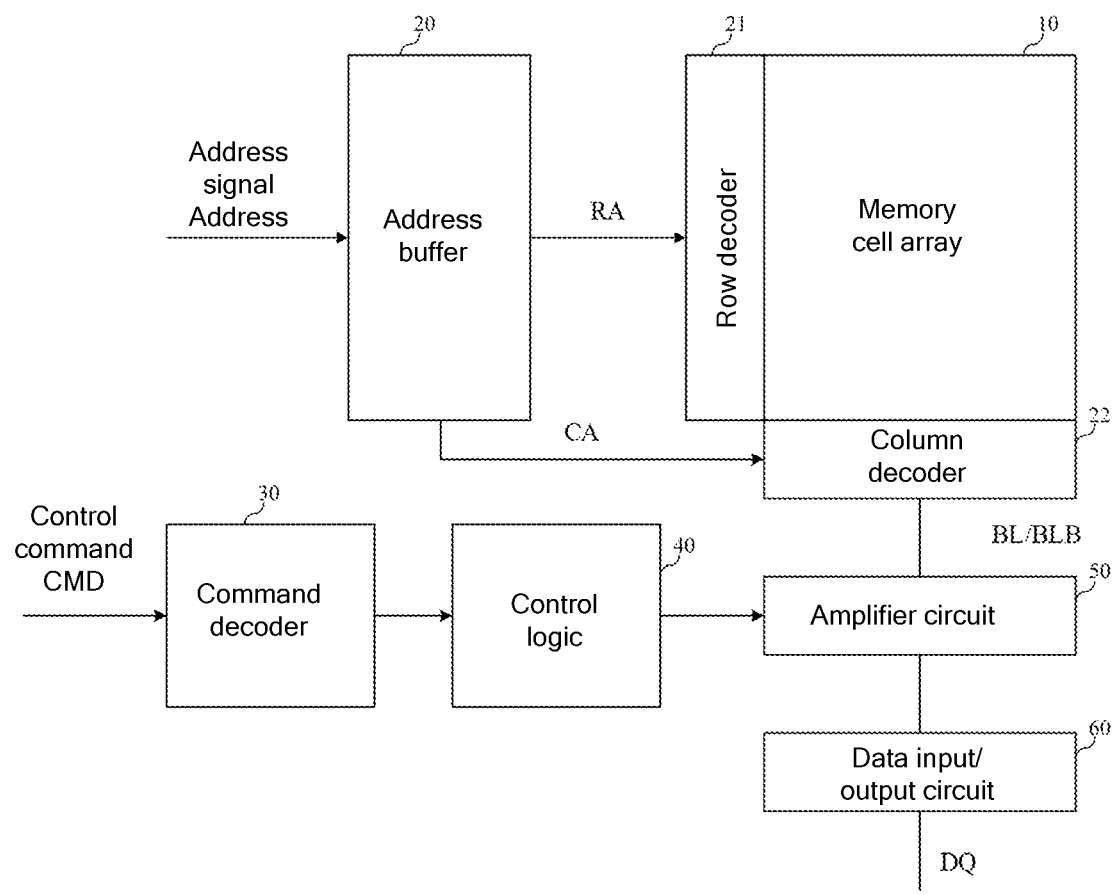
FIG. 10 is a schematic structural diagram of a memory according to still another embodiment of the present disclosure.

FIG. 10 is a schematic structural diagram of a memory according to the embodiments. The memory provided in the embodiments is further described below in detail with reference to the accompanying drawings, and the details are as follows:

Referring to FIG. 10, the memory may be a memory cell or device based on a semiconductor device or component. For example, the memory device may be a volatile memory, for example, a dynamic random-access memory (DRAM), a synchronous dynamic random-access memory (SDRAM), a double data rate synchronous dynamic random-access memory (DDR SDRAM), a low-power double data rate synchronous dynamic random-access memory (LPDDR SDRAM), a graphics double data rate synchronous dynamic random-access memory (GDDR SDRAM), a double data rate type 2 synchronous dynamic random-access memory (DDR2 SDRAM), a double data rate 3 synchronous dynamic random-access memory (DDR3 SDRAM), a double data rate 4 synchronous dynamic random-access memory (DDR4 SDRAM), or a thyristor random-access memory (TRAM); or may be a non-volatile memory, for example, a phase-change random-access memory (PRAM), a magnetoresistive random-access memory (MRAM), or a resistive random-access memory (RRAM).

The memory device may input/output data through a data line DQ in response to a control command CMD or an address signal Address received from an external device such as a memory controller. The memory device includes a memory cell array 10, a command decoder 30, control logic 40, an address buffer 20, a row decoder 21, a column decoder 22, an amplifier circuit 50, and a data input/output circuit 60.

The memory cell array 10 includes multiple memory cells provided in a form of a matrix arranged in multiple rows and multiple columns. The memory cell array 10 includes multiple word lines WL and multiple bit lines BL connected to the memory cells. The multiple word lines WL may be connected to each row of the memory cells, and the multiple bit lines BL may be connected to each column of the memory cells.

The command decoder 30 may decode a write enable signal/WE, a row address strobe signal/RAS, a column address strobe signal/CAS, a chip select signal/CS, or the like received from an external device such as the memory controller, and may allow the control logic 40 to generate a control signal corresponding to the control command CMD.

The control command CMD may include an activate command, a read command, a write command, a precharge command, or the like.

The address buffer 20 receives the address signal Address from the memory controller serving as an external device. The address signal Address includes a row address RA for addressing a row of the memory cell array 10 and a column address CA for addressing a column of the memory cell array 10. The address buffer 120 may send the row address RA to the row decoder 21, and send the column address CA to the column decoder 22.

The row decoder 21 may select any one of the multiple word lines WL connected to the memory cell array 10. The row decoder 21 may decode the row address RA received from the address buffer 120, select any word line corresponding to the row address RA, and activate the selected word line WL.

The column decoder 22 may select a predetermined quantity of bit lines from the multiple bit lines BL of the memory cell array 10. The column decoder 22 may decode the column address CA received from the address buffer 120, and select a predetermined quantity of bit lines BL corresponding to the received column address CA.

The amplifier circuit 50 is connected to the bit lines BL of the memory cell array 10. The amplifier circuit 50 may read out a voltage change in a bit line selected from the multiple bit lines BL, amplify the voltage change, and output the amplified voltage change.

The data input/output circuit 60 may output data through the data line DQ based on the voltage red out and amplified by the amplifier circuit 50.

The amplifier circuit 50 may receive an isolation signal ISO, an offset cancellation signal OC, and the like from the control logic 40. The amplifier circuit 50 may perform an offset cancellation operation in response to the isolation signal ISO and the offset cancellation signal OC. For example, an offset represents a feature difference between semiconductor devices constituting the amplifier circuit 50, for example, a difference between threshold voltages of different semiconductor devices.

Those skilled in the art can understand that the above embodiments are specific embodiments for implementing the present disclosure. In practical applications, various changes may be made to the above embodiments in terms of forms and details without departing from the spirit and scope of the present disclosure.

The invention claimed is:

1. An amplifier circuit, coupled to a bit line and a complementary bit line, and comprising:
a sensing amplification circuit, comprising a readout node, a complementary readout node, a first node, and a second node, wherein at a sensing amplification stage and an offset cancellation stage, the first node is configured to receive a high level, and the second node is configured to receive a low level;
an isolation circuit, coupled to the readout node, the complementary readout node, the bit line, and the complementary bit line, wherein the isolation circuit is configured to couple the readout node to the bit line and the complementary readout node to the complementary bit line at the sensing amplification stage;
an offset cancellation circuit, coupled to the bit line, the complementary bit line, the readout node, and the complementary readout node, wherein the offset cancellation circuit is configured to couple the bit line to the complementary readout node and the complementary bit line to the readout node at the offset cancellation stage; and
a processing circuit, coupled to the offset cancellation circuit, and configured to obtain a memory temperature and adjust duration of the offset cancellation stage based on the memory temperature.

2. The amplifier circuit according to claim 1, wherein the processing circuit comprises:
a temperature detection circuit, configured to obtain the memory temperature;
a configuration circuit, coupled to the temperature detection circuit, and configured to obtain an offset cancellation time corresponding to the memory temperature based on the memory temperature; and
a control circuit, coupled to the configuration circuit and the offset cancellation circuit, and configured to provide an offset cancellation signal of the offset cancellation time at the offset cancellation stage.

3. The amplifier circuit according to claim 2, comprising:
when the memory temperature rises, the processing circuit is configured to reduce the duration of the offset cancellation stage based on the memory temperature; or
when the memory temperature drops, the processing circuit is configured to extend the duration of the offset cancellation stage based on the memory temperature.

4. The amplifier circuit according to claim 2, comprising:
the offset cancellation circuit comprises:
a first offset cancellation transistor, with one of a source or a drain coupled to the bit line, the other one of the source or the drain coupled to the complementary readout node, and a gate used for receiving the offset cancellation signal, wherein
the first offset cancellation transistor is configured to be turned on based on the offset cancellation signal at the offset cancellation stage to couple the complementary readout node to the bit line; and
a second offset cancellation transistor, with one of a source or a drain coupled to the complementary bit line, the other one of the source or the drain coupled to the readout node, and a gate used for receiving the offset cancellation signal, wherein
the second offset cancellation transistor is configured to be turned on based on the offset cancellation signal at the offset cancellation stage to couple the readout node to the complementary bit line.

5. The amplifier circuit according to claim 2, wherein the configuration circuit comprises:
a memory subcircuit, configured to store a logic relationship between the memory temperature and the offset cancellation time; and
an analysis subcircuit, coupling the temperature detection circuit and the memory subcircuit, wherein the analysis subcircuit is configured to obtain the offset cancellation time corresponding to the memory temperature based on the logic relationship.

6. The amplifier circuit according to claim 1, further comprising:
a first power supply circuit, coupled to the first node, and comprising a power supply node, wherein the first power supply circuit is configured to couple the power supply node to the first node at the offset cancellation stage and the sensing amplification stage; and a second power supply circuit, coupled to the second node, and comprising a ground node, wherein the second power supply circuit is configured to couple the ground node to the second node at the offset cancellation stage and the sensing amplification stage.

7. The amplifier circuit according to claim 6, comprising: the first power supply circuit comprises:

a first control transistor, with one of a source or a drain coupled to the power supply node, the other one of the source or the drain coupled to the first node, and a gate used for receiving a control signal;

the second power supply circuit comprises:

a second control transistor, with one of a source or a drain coupled to the second node, the other one of the source or the drain coupled to the ground node, and a gate used for receiving the control signal; and the control signal is used to turn on the first control transistor and the second control transistor at the offset cancellation stage and the sensing amplification stage.

8. The amplifier circuit according to claim 1, wherein the sensing amplification circuit comprises:

a first P-type transistor, with one of a source or a drain coupled to the first node, the other one of the source or the drain coupled to the complementary readout node, and a gate coupled to the readout node;

a second P-type transistor, with one of a source or a drain coupled to the first node, the other one of the source of the drain coupled to the readout node, and a gate coupled to the complementary readout node;

a first N-type transistor, with one of a source or a drain coupled to the second node, the other one of the source or the drain coupled to the complementary readout node, and a gate coupled to the bit line; and a second N-type transistor, with one of a source or a drain coupled to the second node, the other one of the source or the drain coupled to the readout node, and a gate coupled to the complementary bit line; and the isolation circuit comprises:

a first isolation transistor, with one of a source or a drain coupled to the bit line, the other one of the source or the drain coupled to the readout node, and a gate used for receiving an isolation signal, wherein the first isolation transistor is configured to be turned on based on the isolation signal at the sensing amplification stage to couple the readout node to the bit line; and a second isolation transistor, with one of a source or a drain coupled to the complementary bit line, the other one of the source or the drain coupled to the complementary readout node, and a gate used for receiving the isolation signal, wherein the second isolation transistor is configured to be turned on based on the isolation signal at the sensing amplification stage to couple the complementary readout node to the complementary bit line.

9. The amplifier circuit according to claim 1, further comprising: a preprocessing circuit, coupled to the readout node and the complementary readout node, wherein at a charging stage, the preprocessing circuit is coupled to at least one of the readout node or the complementary readout node, and configured to precharge the bit line, the complementary bit line, the readout node, and the complementary readout node to a preset voltage based on a precharge signal; and at an equilibrium stage, the preprocessing circuit is coupled to both the readout node and the complementary readout node, and configured to synchronize a node voltage of the readout node and a node voltage of the complementary readout node based on an equilibrium signal.

10. The amplifier circuit according to claim 9, wherein the preprocessing circuit comprises:

a charge transistor, with one of a source or a drain coupled to the readout node or the complementary readout node, the other one of the source or the drain coupled to a node that provides the preset voltage, and a gate used for receiving the precharge signal, wherein the charge transistor is configured to be turned on based on the precharge signal at the charging stage to precharge the bit line, the complementary bit line, the readout node, and the complementary readout node to the preset voltage; and an equilibrium transistor, with one of a source or a drain coupled to the readout node, the other one of the source or the drain coupled to the complementary readout node, and a gate used for receiving the equilibrium signal, wherein the equilibrium transistor is configured to be turned on based on the equilibrium signal at the equilibrium stage to synchronize the node voltage of the readout node and the node voltage of the complementary readout node.

11. A control method, applying the amplifier circuit according to claim 1, and comprising:

obtaining the memory temperature; and adjusting the duration of the offset cancellation stage based on the memory temperature.

12. The control method according to claim 11, wherein the adjusting the duration of the offset cancellation stage based on the memory temperature comprises:

when the memory temperature rises, reducing the duration of the offset cancellation stage based on the memory temperature; or when the memory temperature drops, extending the duration of the offset cancellation stage based on the memory temperature.

13. The control method according to claim 11, further comprising:

obtaining an offset cancellation time corresponding to the memory temperature based on the memory temperature; and the adjusting the duration of the offset cancellation stage based on the memory temperature comprises: adjusting the duration of the offset cancellation stage based on the offset cancellation time.

14. The control method according to claim 13, wherein the obtaining an offset cancellation time corresponding to the memory temperature based on the memory temperature comprises: obtaining the offset cancellation time corresponding to the memory temperature based on a logic relationship.

15. A memory, comprising the amplifier circuit according to claim 1, wherein the amplifier circuit is configured to perform a read/write operation on data.

* * * * *